US012444588B2

(12) United States Patent
Li et al.

(10) Patent No.: US 12,444,588 B2
(45) Date of Patent: Oct. 14, 2025

(54) METHOD AND APPARATUS FOR PROCESSING WAFERS

(71) Applicant: Lam Research Corporation, Fremont, CA (US)

(72) Inventors: Ming Li, Fremont, CA (US); Benson Quyen Tong, San Jose, CA (US); Chander Radhakrishnan, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 17/253,356

(22) PCT Filed: Jun. 6, 2019

(86) PCT No.: PCT/US2019/035717

§ 371 (c)(1),
(2) Date: Dec. 17, 2020

(87) PCT Pub. No.: WO2020/005491

PCT Pub. Date: Jan. 2, 2020

(65) Prior Publication Data

US 2021/0265136 A1 Aug. 26, 2021

Related U.S. Application Data

(60) Provisional application No. 62/691,922, filed on Jun. 29, 2018.

(51) Int. Cl.

*H01J 37/32* (2006.01)
*C23C 16/455* (2006.01)
*H01L 21/67* (2006.01)

(52) U.S. Cl.

CPC .. *H01J 37/32834* (2013.01); *C23C 16/45565* (2013.01); *H01J 37/32449* (2013.01);
(Continued)

(58) Field of Classification Search

CPC ..... H01J 37/32091–321; H01J 37/3244; H01J 37/32449; H01J 37/32623–32651;
(Continued)

(56) References Cited

U.S. PATENT DOCUMENTS 6,074,486 A * 6/2000 Yang .................... H10D 1/712 118/730
6,149,729 A * 11/2000 Iwata ................ C23C 16/4405 55/312
(Continued)

FOREIGN PATENT DOCUMENTS

CN 102027577 4/2011
JP H09-251981 9/1997
(Continued)

OTHER PUBLICATIONS

International Search Report from International Application No. PCT/US2019/035717 dated Sep. 27, 2019.
(Continued)

*Primary Examiner* — Kurt Sweely
(74) *Attorney, Agent, or Firm* — Beyer Law Group LLP

(57) ABSTRACT

An apparatus for providing plasma processing is provided. A plasma processing chamber is provided. A first turbopump with an inlet is in fluid connection with the plasma processing chamber and an exhaust. A gas source provides gas to the plasma processing chamber. At least one gas line is in fluid connection between the gas source and the plasma processing chamber. At least one bleed line is in fluid connection with the at least one gas line. At least one gas line valve is on the at least one gas line located between, where the at least one bleed line is connected to the at least one gas line and the plasma processing chamber. At least one bypass valve is on the at least one bleed line.

6 Claims, 5 Drawing Sheets

(52) U.S. Cl.
CPC .. *H01J 37/32862* (2013.01); *H01L 21/67069* (2013.01); *H01J 37/32091* (2013.01); *H01J 37/32633* (2013.01); *H01J 37/32642* (2013.01); *H01J 37/32697* (2013.01)

(58) Field of Classification Search
CPC ........... H01J 37/32697; H01J 37/32743; H01J 37/32788; H01J 37/32834; H01J 37/32844; H01J 37/32862; C23C 16/4405; C23C 16/4408; C23C 16/45517; C23C 16/45557; C23C 16/45561; C23C 16/45565; C23C 16/45593; H01L 21/67069
See application file for complete search history.

(56) References Cited

U.S. PATENT DOCUMENTS

| | | | | |
|---|---|---|---|---|
| 6,306,247 | B1 * | 10/2001 | Lin | H01J 37/321 118/723 E |
| 6,590,344 | B2 * | 7/2003 | Tao | C23C 16/45574 315/111.21 |
| 6,610,169 | B2 * | 8/2003 | Nguyen | C23C 16/45561 118/723 MP |
| 7,628,931 | B2 | 12/2009 | Saito et al. | |
| 7,767,584 | B1 * | 8/2010 | Singh | H01J 37/321 438/719 |
| 7,968,437 | B2 | 6/2011 | Itatani et al. | |
| 8,202,393 | B2 * | 6/2012 | Wong | C23C 16/4412 118/715 |
| 9,355,857 | B2 | 5/2016 | Jeon et al. | |
| 11,742,188 | B2 * | 8/2023 | Miura | H01J 37/3244 156/345.26 |
| 2004/0112540 | A1 * | 6/2004 | Larson | H01J 37/3244 257/E21.252 |
| 2006/0121211 | A1 * | 6/2006 | Choi | C23C 16/401 427/248.1 |
| 2009/0130859 | A1 * | 5/2009 | Itatani | C23C 16/0272 257/E21.24 |
| 2009/0286397 | A1 | 11/2009 | Sadjadi | |
| 2013/0180951 | A1 * | 7/2013 | Indrakanti | H01L 21/027 216/41 |
| 2016/0027618 | A1 * | 1/2016 | Kawakami | H01J 37/32816 156/345.29 |

FOREIGN PATENT DOCUMENTS

| | | |
|---|---|---|
| JP | 2005-101626 | 4/2005 |
| KR | 2006-0063188 | 6/2006 |
| KR | 2016-0012302 | 2/2016 |
| TW | I383449 | 11/1995 |
| TW | 201409559 | 3/2014 |

OTHER PUBLICATIONS

Written Opinion from International Application No. PCT/US2019/035717 dated Sep. 27, 2019.
Taiwanese Office Action from Taiwanese Application No. 108122108 dated Mar. 7, 2023.
Korean Office Action from Korean Application No. 10-2021-7003029 dated Mar. 4, 2024 and machine translation.
Chinese First Office Action from Chinese Application No. 201980043733.4 dated Jun. 20, 2024 and machine translation.
Korean Office Action from Korean Application No. 10-2021-7003029 dated Mar. 4, 2024 with machine translation.
Chinese Second Office Action from Chinese Application No. 201980043733.4 dated Jan. 14, 2025 with Machine Translation.
Korean Office Action from Korean Application No. 10-2021-7003029 dated Aug. 28, 2025 with Machine Translation.

* cited by examiner

METHOD AND APPARATUS FOR PROCESSING WAFERS

CROSS REFERENCE TO RELATED APPLICATION

This application claims the benefit of priority of U.S. Provisional Application No. 62/691,922, filed Jun. 29, 2018, which is incorporated herein by reference for all purposes.

BACKGROUND

Field

The disclosure relates to methods of forming semiconductor devices on a semiconductor wafer. More specifically, the disclosure relates to maintaining wafer-to-wafer uniformity while processing wafers.

In forming semiconductor devices, etch layers may be selectively etched with respect to an organic patterned mask to form recessed features memory holes or lines. Residues are deposited within the plasma processing chambers. The residues may be removed between the processing of each substrate/wafer.

SUMMARY

To achieve the foregoing and in accordance with the purpose of the present disclosure, an apparatus for providing plasma etching is provided. A plasma processing chamber, such as an etch chamber, is provided. A first turbopump with an inlet is in fluid connection with the plasma processing chamber and an exhaust. A gas source provides gas to the plasma processing chamber. At least one gas line is in fluid connection between the gas source and the plasma processing chamber. At least one bleed line is in fluid connection with the at least one gas line. At least one gas line valve is on the at least one gas line located between, where the at least one bleed line is connected to the at least one gas line and the plasma processing chamber. At least one bypass valve is on the at least one bleed line.

In another manifestation, a method for processing wafers in a plasma processing system, the plasma processing system including a plasma processing chamber and at least one gas line, the method comprising a plurality of cycles is provided. Each cycle comprises placing a wafer in the etch chamber, processing the wafer, removing the wafer from the plasma processing chamber, cleaning an interior of the etch chamber with a waferless cleaning, and purging the at least one gas line with an inert gas including at least one of nitrogen (N2), helium (He), and argon (Ar).

These and other features of the present disclosure will be described in more detail below in the detailed description and in conjunction with the following figures.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION OF EMBODIMENTS

The present disclosure will now be described in detail with reference to a few preferred embodiments thereof as illustrated in the accompanying drawings. In the following description, numerous specific details are set forth in order to provide a thorough understanding of the present disclosure. It will be apparent, however, to one skilled in the art, that the present disclosure may be practiced without some or all of these specific details. In other instances, well-known process steps and/or structures have not been described in detail in order to not unnecessarily obscure the present disclosure.

Figure 1:
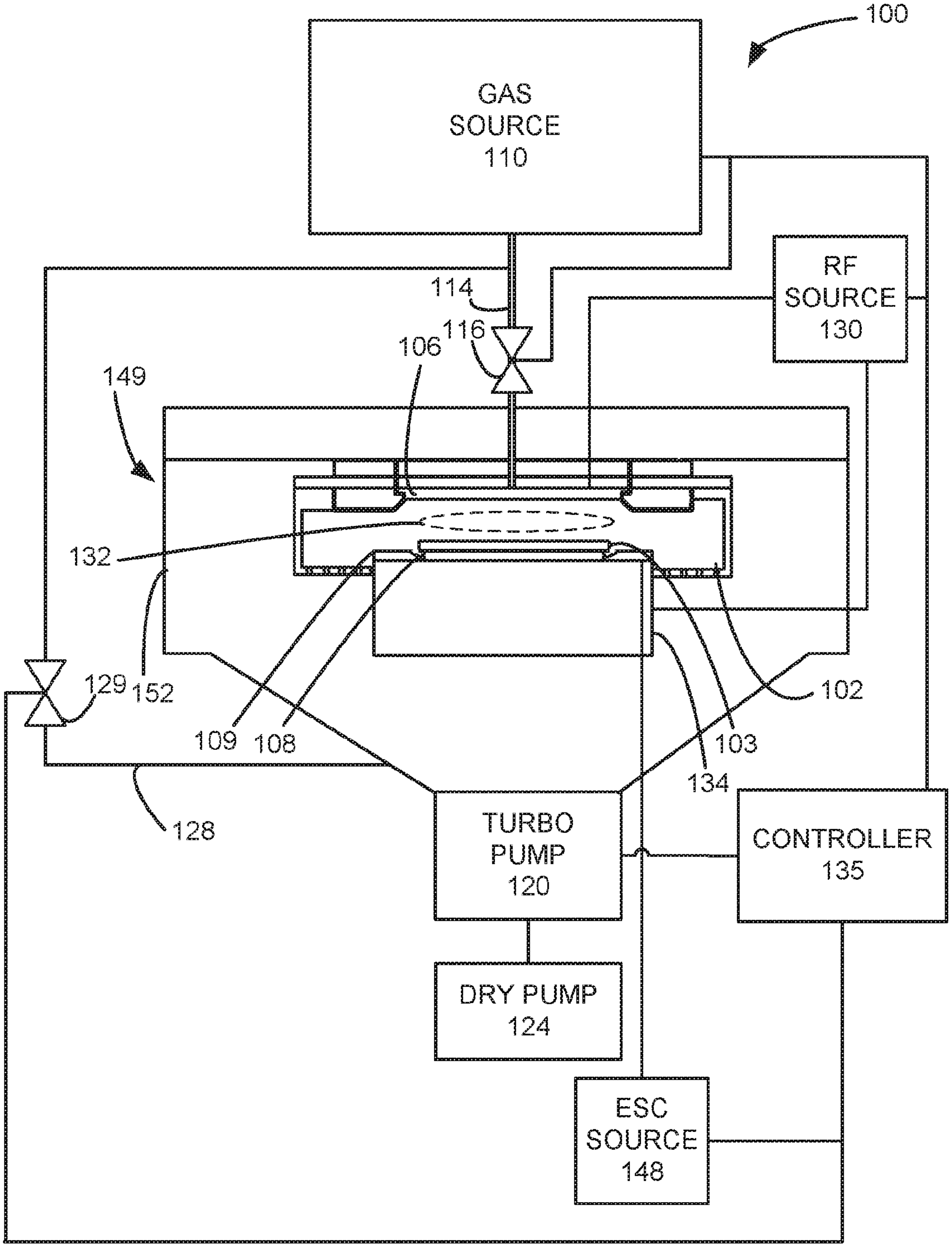
FIG. 1 is a schematic view of a etch chamber that may be used in an embodiment.

FIG. 1 is a schematic view of a plasma processing chamber that may be used in an embodiment. In one or more embodiments, a plasma processing chamber 100 comprises a gas distribution plate 106 providing a gas inlet and an electrostatic chuck (ESC) 108, within an etch chamber 149, enclosed by a chamber wall 152. Within the etch chamber 149, a wafer 103 is positioned over the ESC 108. An edge ring 109 surrounds the ESC 108. An ESC source 148 may provide a bias to the ESC 108. A gas source 110 is connected to the etch chamber 149 through a gas line 114 and the gas distribution plate 106. The gas line 114 has a gas line valve 116.

A radio frequency (RF) source 130 provides RF power to a lower electrode and/or an upper electrode, which in this embodiment are the ESC 108 and the gas distribution plate 106, respectively. In an exemplary embodiment, 400 kHz, 60 MHz, and optionally 2 MHZ, 27 MHz power sources make up the RF source 130 and the ESC source 148. In this embodiment, the upper electrode is grounded. In this embodiment, one generator is provided for each frequency. In other embodiments, the generators may be in separate RF sources, or separate RF generators may be connected to different electrodes. For example, the upper electrode may have inner and outer electrodes connected to different RF sources. Other arrangements of RF sources and electrodes may be used in other embodiments. An inlet side of a turbopump 120 is in fluid connection with the etch chamber 149.

An inlet side of a dry pump 124 is in fluid connection with an exhaust side of the turbopump 120. A bleed line 128 is connected between the gas line 114 and the etch chamber 149. The bleed line 128 has a bleed line valve 129. A plasma zone 132 is a region where a plasma is generated in the etch chamber 149. Gas flowing through the gas line 114 and the gas distribution plate 106 is provided at a first side of the plasma zone 132 so that the gas passes through the plasma zone 132 to reach the turbopump 120. Gas flowing through the bleed line 128 is provided to the etch chamber 149 at a second side of the plasma zone 132 so that gas flowing from the bleed line 128 does not pass through the plasma zone 132 to reach the turbopump 120. A controller 135 is controllably connected to the RF source 130, the ESC source 148, the turbopump 120, the gas line valve 116, the bleed line valve 129, and the gas source 110. An example of such an etch chamber is the Exelan Flex™ etch system manufactured by Lam Research Corporation of Fremont, CA. The process chamber can be a CCP (capacitively coupled plasma) reactor or an ICP (inductively coupled plasma) reactor.

Figure 2:
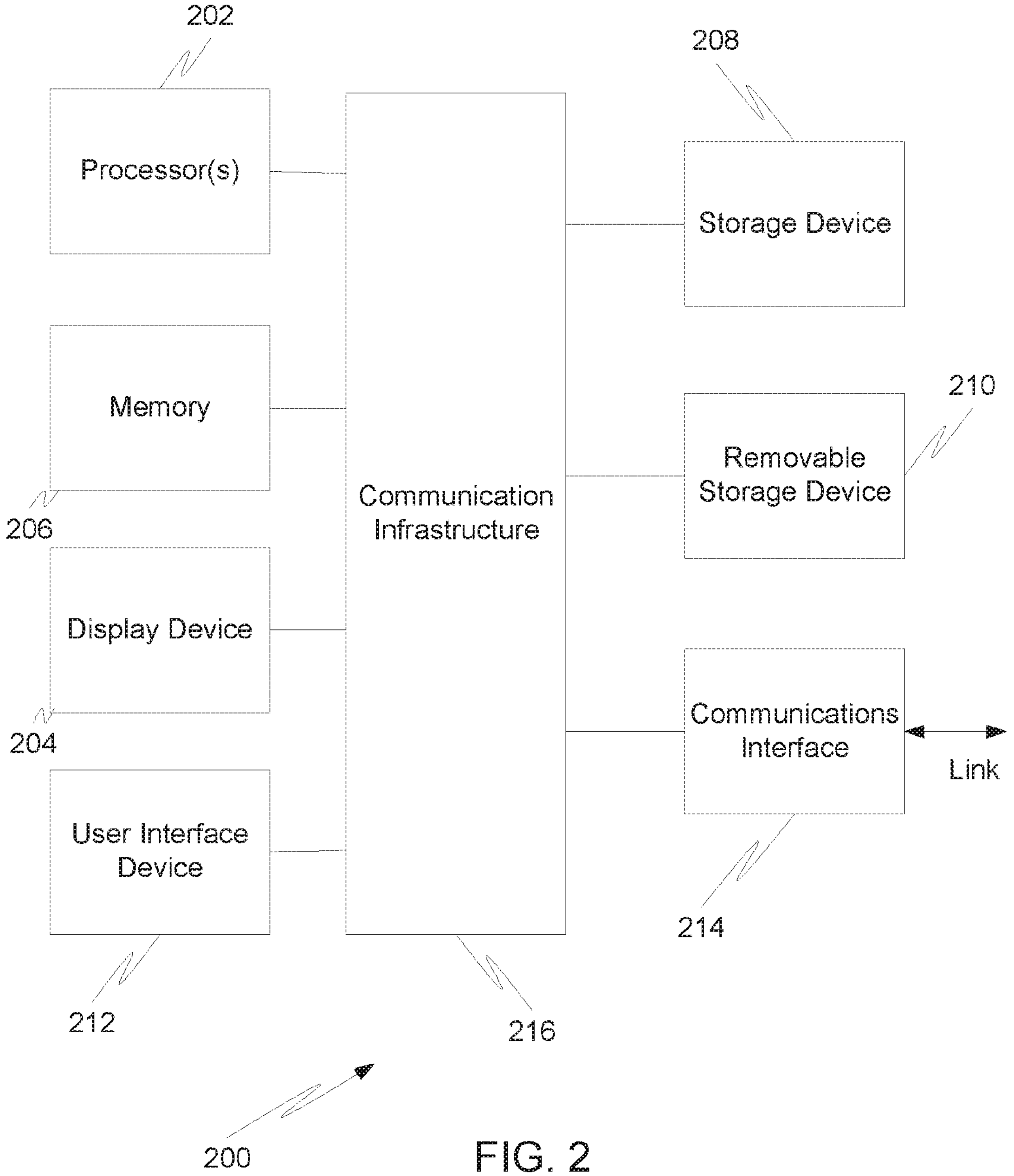
FIG. 2 is a schematic view of a computer system that may be used in practicing an embodiment.

FIG. 2 is a high level block diagram showing a computer system 200, which is suitable for implementing a controller 135 used in embodiments. The computer system may have many physical forms ranging from an integrated circuit, a printed circuit board, and a small handheld device up to a huge super computer. The computer system 200 includes one or more processors 202, and further can include an electronic display device 204 (for displaying graphics, text, and other data), a main memory 206 (e.g., random access memory (RAM)), storage device 208 (e.g., hard disk drive), removable storage device 210 (e.g., optical disk drive), user interface devices 212 (e.g., keyboards, touch screens, keypads, mice or other pointing devices, etc.), and a communication interface 214 (e.g., wireless network interface). The communication interface 214 allows software and data to be transferred between the computer system 200 and external devices via a link. The system may also include a communications infrastructure 216 (e.g., a communications bus, cross-over bar, or network) to which the aforementioned devices/modules are connected.

Information transferred via communications interface 214 may be in the form of signals such as electronic, electromagnetic, optical, or other signals capable of being received by communications interface 214, via a communication link that carries signals and may be implemented using wire or cable, fiber optics, a phone line, a cellular phone link, a radio frequency link, and/or other communication channels. With such a communications interface, it is contemplated that the one or more processors 202 might receive information from a network, or might output information to the network in the course of performing the above-described method steps. Furthermore, method embodiments may execute solely upon the processors or may execute over a network such as the Internet, in conjunction with remote processors that share a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 3:
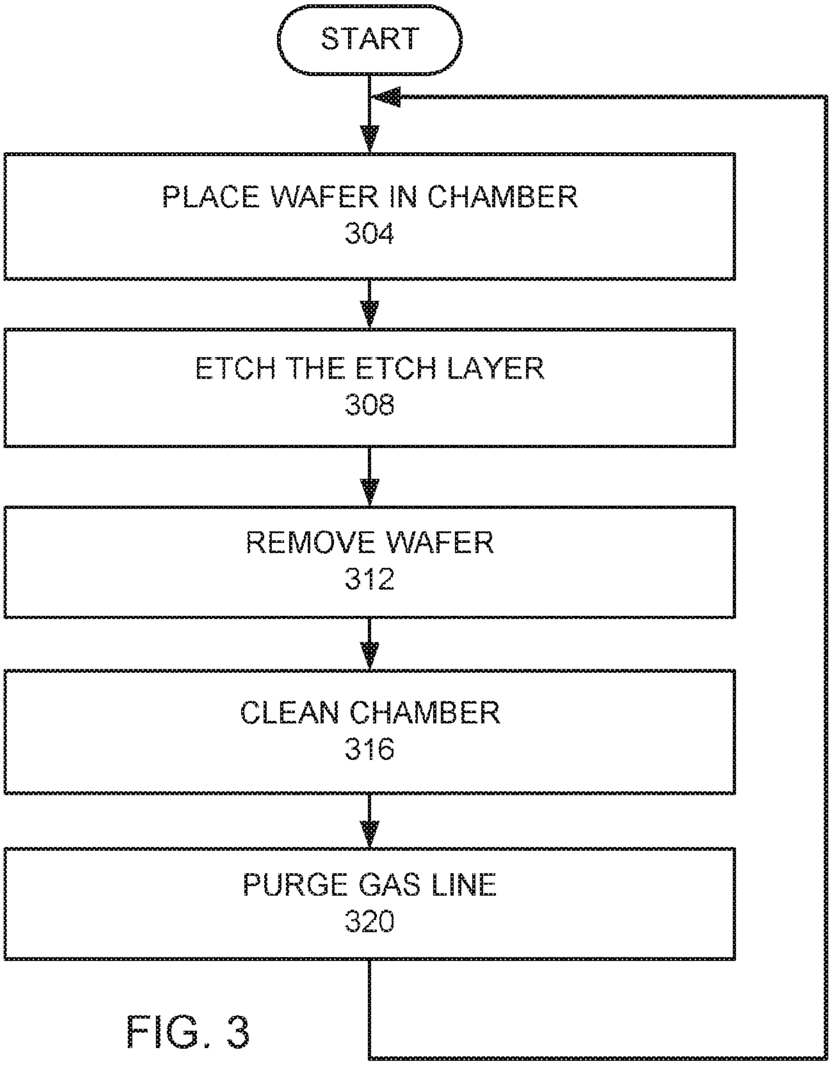
FIG. 3 is a high level flow chart of an embodiment.

FIG. 3 is a high level flow chart of an embodiment. In this embodiment, a wafer with an etch layer under an organic patterned mask is placed in a plasma processing chamber (step 304). The etch layer is etched (step 308). The wafer is removed from the plasma processing chamber (step 312). The plasma processing chamber is cleaned (step 316). At least one gas line is purged (step 320). The process is repeated by going to step 304 and placing another wafer in the plasma processing chamber.

Example

In an exemplary embodiment, a wafer 103 with an etch layer under an organic patterned mask is placed in a plasma processing chamber 100 (step 304). After the wafer 103 has been placed into the plasma processing chamber 100, an etch layer is etched (step 308). In this embodiment, the etch layer is a silicon oxide ($SiO_2$) layer over the wafer 103 and under a photoresist mask. The wafer 103 is removed from the plasma processing chamber 100 (step 312).

The plasma processing chamber 100 is cleaned (step 316). In this embodiment, a waferless auto clean (WAC) is used. An exemplary recipe for the WAC provides a flow of 800 sccm $O_2$ into the plasma processing chamber 100. 400 watts of RF power at a frequency of 600 MHz is provided to transform the $O_2$ gas into a plasma. The plasma cleans residue in the plasma processing chamber 100.

The gas line 114 is purged (step 320). In this embodiment, oxygen remaining in the gas line 114 is removed. The gas line valve 116 is closed and the bleed line valve 129 is opened. The turbopump 120 continues to provide a vacuum. Oxygen in the gas line 114 is drawn through the bleed line 128 and the plasma processing chamber 100 into the turbopump 120. Any remaining oxygen from the gas line 114 is purged. The cycle is repeated by placing another wafer 103 into the plasma processing chamber 100.

It has been found in the prior art that the length of idle time between the completion of cleaning the plasma processing chamber 100 and the beginning the etching of the etch layer affect the critical dimension (CD) of the etching of the etch layer, which is called an idle effect. Because of the idle effect, CD uniformity between wafers decreases, thereby increasing semiconductor device defects. Reducing or eliminating the idle effect has been investigated for years. Without being bound by theory, it has been unexpectedly found that remaining oxygen in the gas line 114 after cleaning the plasma processing chamber 100 leaks into the plasma processing chamber 100. The leaked oxygen strips some of the organic patterned mask, which changes the CD. Thus, it was unexpectedly found that purging oxygen from the gas line 114 reduced or eliminated the idle effect.

In determining whether residual oxygen in the gas line caused the observed reduction in CD uniformity, experiments were carried out where oxygen was purged from the gas line. It was unexpectedly found that such purging increased CD uniformity by at least four times.

In one embodiment, since the turbopump 120 has a single inlet connection, the bleed line 128 is connected to the inlet of the turbopump 120 through the plasma processing chamber 100. The bleed line 128 is connected to the plasma processing chamber 100 close to the inlet of the turbopump 120. The location of the connection between the bleed line 128 and the plasma processing chamber 100 allows gas to pass from the bleed line 128 to the turbopump 120 without passing through the plasma zone 132.

The plasma processing chamber 100 may be a module of a larger wafer processing system. Such a wafer processing system may have a load lock and a wafer transfer module that transfers wafers between the load lock and various processing chambers. In some embodiments, the time it takes to transfer a wafer through a wafer transfer module to the plasma processing chamber 100 is about the time it takes to purge the gas line (step 320). Therefore, transferring of the wafer may be performed at the same time as the purging of the gas line (step 320). In such embodiments, the purging of the gas line (320) does not add to the overall processing time.

Figure 4:
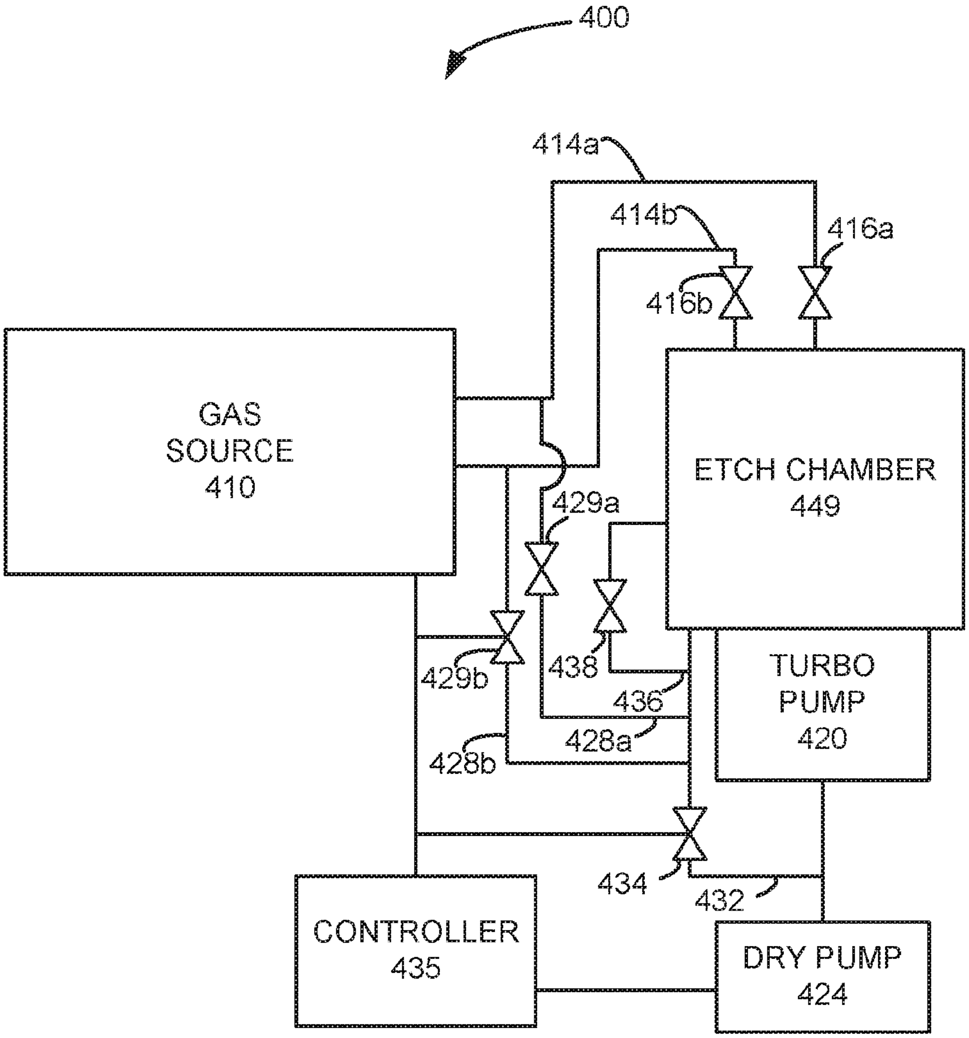
FIG. 4 is a schematic view of another embodiment.

FIG. 4 is a schematic view of an alternative embodiment of a plasma processing chamber 400. The etch chamber 449 is connected to the turbopump 420. The turbopump 420, in turn, is connected to a dry pump 424. Typically, a turbopump 420 is able to pump down to a pressure of about 108 mTorr. A dry pump 424 is able to pump down to a pressure of about 10 mTorr. A gas source 410 supplies gas to the etch chamber 449. A first gas line **414*a* is connected between the gas source 410 and a center region of the top of the etch chamber 449. A first gas line valve 416*a* is on the first gas line 414*a*. A second gas line 414*b*** is connected between the gas source 410 and a peripheral region of the top of the etch chamber 449. A second gas line valve 416*b* is on the second gas line 414*b*.

A first bleed line 428*a* is connected to the first gas line 414*a*. A first bleed line valve 429*a* is on the first bleed line 428*a*. A second bleed line 428*b* is connected to the second gas line 414*b*. A second bleed line valve 429*b* is on the second bleed line 428*b*. The first bleed line 428*a* and the second bleed line 428*b* are connected to a bottom chamber line 432, which is connected to the bottom of the etch chamber 449. The bottom chamber line 432 has a bottom chamber line valve 434. A helium pump out line 436 extends from the etch chamber 449 to the bottom chamber line 432. The helium pump out line 436 has a pump out valve 438. The bottom chamber line 432 is also in fluid connection to the dry pump 424. A controller 435 is controllably connected to the etch chamber 449, the turbopump 420, the dry pump 424, the gas source 410, the first gas line valve 416*a*, the second gas line valve 416*b*, the first bleed line valve 429*a*, the second bleed line valve 429*b*, the bottom chamber line valve 434, and the pump out valve 438.

In an exemplary embodiment, a wafer (not shown) with an etch layer under an organic patterned mask is placed in the etch chamber 449 (step 304). After the wafer (not shown) has been placed into the etch chamber 449, an etch layer is etched (step 308). In this embodiment, the etch layer is a silicon oxide ($SiO_2$) layer over the wafer (not shown) and under a photoresist mask. An etching gas is flowed from the gas source 410 into the etch chamber 449. The etching gas is transformed into a plasma, which etches the etch layer on the wafer (not shown). The wafer (not shown) is removed from the etch chamber 449 (step 312).

The interior of the etch chamber 449 is cleaned (step 316). In this example, both the first gas line 414*a* and the second gas line 414*b* are used to flow cleaning gas from the gas source 410 to the etch chamber 449. In this embodiment, the cleaning gas comprises oxygen. The first gas line 414*a* and the second gas line 414*b* are purged (step 320). In this embodiment, oxygen remaining in the first gas line 414*a* and the second gas line 414*b* is removed. The first gas line valve 416*a* and the second gas line valve 416*b* are closed and the first bleed line valve 429*a* and the second bleed line valve 429*b* are opened. The turbopump 420 continues to provide a vacuum. Oxygen in the first gas line 414*a* and in the second gas line 414*b* is drawn respectively through the first bleed line 428*a* and the second bleed line 428*b* and the etch chamber 449 into the turbopump 420. The remaining oxygen in the first gas line 414*a* and the second gas line 414*b* is purged. The cycle is repeated by placing another wafer (not shown) into the etch chamber 449. The turbopump 420 is continuously running during each cycle.

This embodiment provides for the purging of more than one gas line. Multiple gas lines allow for different gas zones that provide different gases, or different flow rates of gases, or different ratios of gases.

Figure 5:
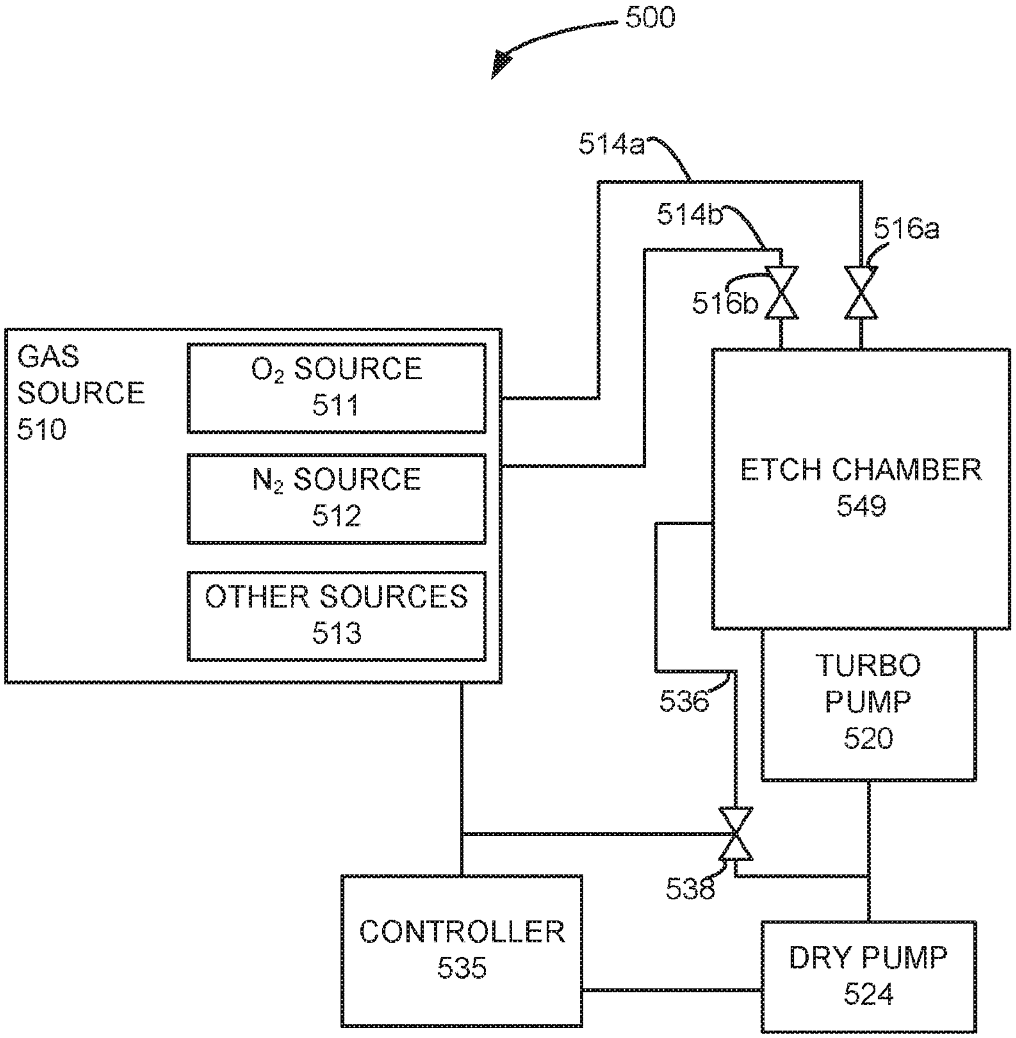
FIG. 5 is a schematic view of another embodiment.

FIG. 5 is a schematic view of an alternative embodiment of a plasma processing chamber 500. The etch chamber 549 is connected to the turbopump 520. The turbopump 520, in turn, is connected to a dry pump 524. A gas source 510 supplies gas to the etch chamber 549. The gas source 510 comprises an oxygen ($O_2$) source 511, a nitrogen ($N_2$) source 512, and other gas sources 513. A first gas line 514*a* is connected between the gas source 510 and a center region of the top of the etch chamber 549. A first gas line valve 516*a* is on the first gas line 514*a*. A second gas line 514*b* is connected between the gas source 510 and a peripheral region of the top of the etch chamber 549. A second gas line valve 516*b* is on the second gas line 514*b*. A helium pump out line 536 extends from the etch chamber 549 to the dry pump 524. The helium pump out line 536 has a pump out valve 538. A controller 535 is controllably connected to the etch chamber 549, the turbopump 520, the dry pump 524, the gas source 510, the first gas line valve 516*a*, the second gas line valve 516*b*, and the pump out valve 538.

In an exemplary embodiment, a wafer (not shown) with an etch layer under an organic patterned mask is placed in the etch chamber 549 (step 304). After the wafer (not shown) has been placed into the etch chamber 549, an etch layer is etched (step 308). In this embodiment, the etch layer is a silicon oxide ($SiO_2$) layer over the wafer (not shown) and under a photoresist mask. The wafer (not shown) is removed from the etch chamber 549 (step 312).

The etch chamber 549 is cleaned (step 316). In this example, both the first gas line 514*a* and the second gas line 514*b* are used to flow cleaning gas from the gas source 510 to the etch chamber 549. In this embodiment, the cleaning gas comprises oxygen. The first gas line 514*a* and the second gas line 514*b* are purged (step 320). In this embodiment, the first gas line valve 516*a* and the second gas line valve 516*b* remain open. The turbopump 520 continues to provide a vacuum. A purge gas, such as $N_2$, that is inert to the patterned organic mask is flowed from the $N_2$ source 512. In this embodiment, at least 1000 sccm $N_2$ is flowed through the first gas line 514*a* and the second gas line 514*b*. In this example, the purging of the first gas line 514*a* and the second gas line 514*b* occurs for about 10 seconds. Preferably, the purging occurs for at least 3 seconds. Other embodiments provide a purging of at least 5 seconds. The remaining oxygen in the first gas line 514*a* and the second gas line 514*b* is purged by the flow of the purge gas. The cycle is repeated by placing another wafer into the etch chamber 549. In other embodiments, other gas line setups may provide sufficient purging with a lower flow rate of $N_2$.

In other embodiments, the purge gas may be argon (Ar) or helium (He). Other embodiments flow at least 2000 sccm of the purge gas. Other embodiments may use other methods to purge the gas line 114 after the etch chamber 149 is cleaned. Other embodiments may have three or more gas lines 114. Other embodiments may provide methods or apparatuses for etching dielectric or conductive materials. In another embodiment, the bleed line 128 may be connected to a second turbo pump in order to purge the gas line 114. Other embodiments may have a deposition process or other wafer process instead of an etch process.

While this disclosure has been described in terms of several preferred embodiments, there are alterations, modifications, permutations, and various substitute equivalents, which fall within the scope of this disclosure. It should also be noted that there are many alternative ways of implementing the methods and apparatuses of the present disclosure. It is therefore intended that the following appended claims be interpreted as including all such alterations, modifications, permutations, and various substitute equivalents as fall within the true spirit and scope of the present disclosure.

What is claimed is:

1. An apparatus for providing plasma processing of a substrate, comprising:

plasma processing chamber with a plasma zone;

a first turbopump with an inlet in fluid connection with the plasma processing chamber and an exhaust;

a gas source for providing gas to the plasma processing chamber;

at least one gas line connected to the gas source and the plasma processing chamber, wherein the at least one gas line is connected to the plasma processing chamber on a first side of the plasma zone so that gas provided by the at least one gas line is provided on the first side of a plasma zone above the substrate so that gas from the at least one gas line passes through the plasma zone;

at least one bleed line connected to the at least one gas line, wherein the at least one bleed line is connected to the plasma processing chamber below the substrate so that gas provided by the at least one bleed line passes into the plasma processing chamber below the substrate and flows to the inlet of the first turbopump without passing through the plasma zone of the plasma processing chamber;

at least one gas line valve on the at least one gas line located between where the at least one bleed line is connected to the at least one gas line and the plasma processing chamber;

at least one bypass valve on the at least one bleed line;

a dry pump with an inlet in fluid connection to the exhaust of the first turbopump, wherein the at least one bleed line is in fluid connection with the dry pump;

at least one pump out valve connected between the at least one bleed line and the dry pump; and a controller controllably connected to the at least one gas line valve and the at least one bypass valve, and the gas source, wherein the controller comprises:

at least one processor; and non-transitory computer readable media, comprising computer code for providing a plurality of cycles, wherein each cycle comprises:

opening the at least one gas line valve and closing the at least one bypass valve;

transferring a first wafer into the plasma processing chamber;

etching an etch layer on the first wafer in the plasma processing chamber;

removing the first wafer from the plasma processing chamber;

providing a waferless clean of the plasma processing chamber; and purging gas in the at least one gas line via the at least one bleed line after providing the waferless clean, wherein the purging passes gas from the at least one gas line into the plasma processing chamber below the substrate so that gas provided by the at least one bleed line passes into the plasma processing chamber below the substrate and flows to the inlet of the first turbopump without passing through the plasma zone.

2. The apparatus, as recited in claim 1, wherein the computer code for purging the gas in the at least one gas line includes computer code for closing the at least one gas line valve and opening the at least one bypass valve to allow the gas in the at least one gas line to be evacuated through the at least one bleed line.

3. The apparatus, as recited in claim 2, further comprising a wafer transfer module connected to the plasma processing chamber, wherein the computer code for purging comprises computer code for purging when a wafer is being transferred through the wafer transfer module to the plasma processing chamber after providing the waferless clean.

4. The apparatus, as recited in claim 1, wherein an inert gas including at least one of nitrogen (N2), helium (He), and argon (Ar) is used to purge the gas in the at least one gas line.

5. The apparatus, as recited in claim 1, wherein the computer code for each cycle, further comprises:

computer code for transferring another wafer with an etch layer in the plasma processing chamber after purging gas in the at least one gas line; and computer code for etching an etch layer on the another wafer in the plasma processing chamber.

6. The apparatus, as recited in claim 1, further comprising:

a bottom chamber line connected to the plasma processing chamber and the dry pump;

a second gas line connected to the gas source and the plasma processing chamber;

a second bleed line connected to the second gas line and the bottom chamber line; and a second bleed line valve on the second bleed line between the connection to the second gas line and the connection to the bottom chamber line.

* * * * *